(12) United States Patent
Savage et al.

(10) Patent No.: US 6,304,107 B1
(45) Date of Patent: Oct. 16, 2001

(54) COMPARATOR METASTABILITY PERFORMANCE FROM AN ENHANCED COMPARATOR DETECTION CIRCUIT

(75) Inventors: Scott C. Savage; Rick F. Bitting, both of Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/513,018

(22) Filed: Feb. 25, 2000

(51) Int. Cl.[7] .................................................. H03K 5/24
(52) U.S. Cl. .................................................. 327/57; 327/65
(58) Field of Search .................................. 327/54, 55, 57, 327/65, 67, 82, 85, 87, 89, 80, 81

(56) References Cited

U.S. PATENT DOCUMENTS

| | | | |
|---|---|---|---|
| 5,306,970 | * | 4/1994 | Phillips .................................... 327/57 |
| 5,872,465 | * | 2/1999 | Saitoh ...................................... 327/54 |
| 5,959,919 | * | 9/1999 | Choi ........................................ 365/207 |

* cited by examiner

*Primary Examiner*—Tuan T. Lam
(74) *Attorney, Agent, or Firm*—Trexler, Bushnell, Giangiorgi, Blackstone & Marr, Ltd.

(57) ABSTRACT

A detection circuit for receiving a pair of unstable input signals along a pair of input leads and providing a stable output signal along an output lead, preferably to downstream circuitry. The detection circuit includes a plurality of transistors including a first transistor and a second transistor, wherein at least one of the first and second transistors is configured to turn on upon the detection circuit receiving input signals along the pair of input leads. At least one of the first and second transistors is configured to provide a signal along a lead to circuitry which is configured to condition the output signal and turn on a third transistor. The third transistor is connected to the first and said second transistors such that when the third transistor turns on, the third transistor prevents the first and second transistors from turning on until a new clock signal is received by the detection circuit. Thus, the third transistor generally prevents any new input signals received along the input leads from propagating substantially through the detection circuit. Large differential hysteresis prevents small signals from propagating. The third transistor effectively limits the time period for decision making.

10 Claims, 1 Drawing Sheet

COMPARATOR METASTABILITY PERFORMANCE FROM AN ENHANCED COMPARATOR DETECTION CIRCUIT

BACKGROUND OF THE INVENTION

Comparators are often employed in connection with devices such as data converters, control systems and feedback loops. Generally, detection circuitry is provided between a comparator and downstream circuitry. Hence, the comparator drives the inputs of the detection circuitry. Oftentimes, the circuitry which is downstream from the detection circuitry and receives the output of the detection circuitry is digital. For optimum performance, it is important for a detection circuit to be configured to quickly and consistently supply a single, definite output to the downstream circuitry. If the circuit fails to provide a stable output to downstream circuitry, data conversion speed and accuracy, for example, may suffer.

Normally, a comparator drives the inputs of a detection circuit to the supply rails, wherein the supply rails comprise the power supply to the detection circuit. Comparator metastability occurs when a comparator is not able to achieve a definite decision level for the downstream circuitry. Metastability may occur when the outputs of a comparator are balanced between the supply rails. A metastable condition may also occur if a differential between the outputs of the comparator (the inputs of the detection circuit) is too small. In such a case, the detection circuit may take too much time to attain a decision level. Another common metastable condition is when the comparator attains multiple decision levels within a single clock cycle, thereby confusing downstream circuitry.

The advantages of avoiding a metastability condition include, but are not limited to: improved data conversion speed and accuracy (i.e., lower Bit Error Rate (BER)), allowing new applications for older or generally unconventional circuit topologies, providing smaller comparator gain stages, providing less comparator gain stages, providing that control loops are more stable and providing that control loops have higher bandwidths.

OBJECTS AND SUMMARY

It is an object of an embodiment of the present invention to provide a detection circuit which provides improved metastability performance.

It is a further object of an embodiment of the present invention to provide a detection circuit which provides a high common mode rejection ratio and high common mode input range.

It is a further object of an embodiment of the present invention to provide a detection circuit which provides a large input hysteresis range that improves metastability rejection.

It is a further object of an embodiment of the present invention to provide a detection circuit which reduces the amount of time required to make a decision for a small, metastable-prone input signal.

Briefly, and in accordance with at least one of the foregoing objects, an embodiment of the present invention provides a detection circuit for receiving a pair of unstable input signals along a pair of input leads, such as from a comparator, and providing a stable output signal along an output lead, preferably to downstream circuitry. The detection circuit includes a plurality of transistors including a first transistor and a second transistor, wherein at least one of the first and second transistors is configured to turn on upon the detection circuit receiving input signals along the pair of input leads. At least one of the first and second transistors is configured to provide a signal along a lead to circuitry which is configured to condition the output signal and turn on a third transistor. The third transistor is connected to the first and said second transistors such that when the third transistor turns on, the third transistor prevents the first and second transistors from turning on until a new clock signal is received by the detection circuit. Thus, the third transistor generally prevents any new input signals received along the input leads from propagating substantially through the detection circuit.

Preferably, the first, second and third transistors are n-channel transistors and the feedback circuitry includes a plurality of logic devices such as nor gates, wherein at least one of the logic devices is connected to a pair of output leads. Specifically, preferably an output of a first logic device is connected to an input of a second logic device, and to the third transistor, and an output of the second logic device is connected to an input of the first logic device. Preferably, the anti-propagation circuitry also includes a fourth and fifth transistor which are connected to the first and second transistors. Preferably, the fourth and fifth transistors are p-channel transistors. The first and second transistors are configured to be off while the fourth and fifth transistors are configured to be on if generally equal input signals are received along the input leads. Preferably, the detection circuit is configured to provide that the output leads are low if generally equal input signals are received along the input leads. As such, the detection circuit is configured to hold a previous clock cycle value output at the output lead if generally equal input signals are received along the input leads. Desirably, the detection circuit is configured such that the third transistor turns on upon a differential between the input signals being greater than 2 vts. (approximately 1.3 volts). In addition, the time it takes to attain a decision level is limited to a desired time interval where the differential between the input signals is small.

BRIEF DESCRIPTION OF THE DRAWING

The present invention and the advantages thereof will become more apparent upon consideration of the following detailed description when taken in conjunction with the accompanying drawing of which

DETAILED DESCRIPTION OF AN EMBODIMENT OF THE INVENTION

Figure 1:
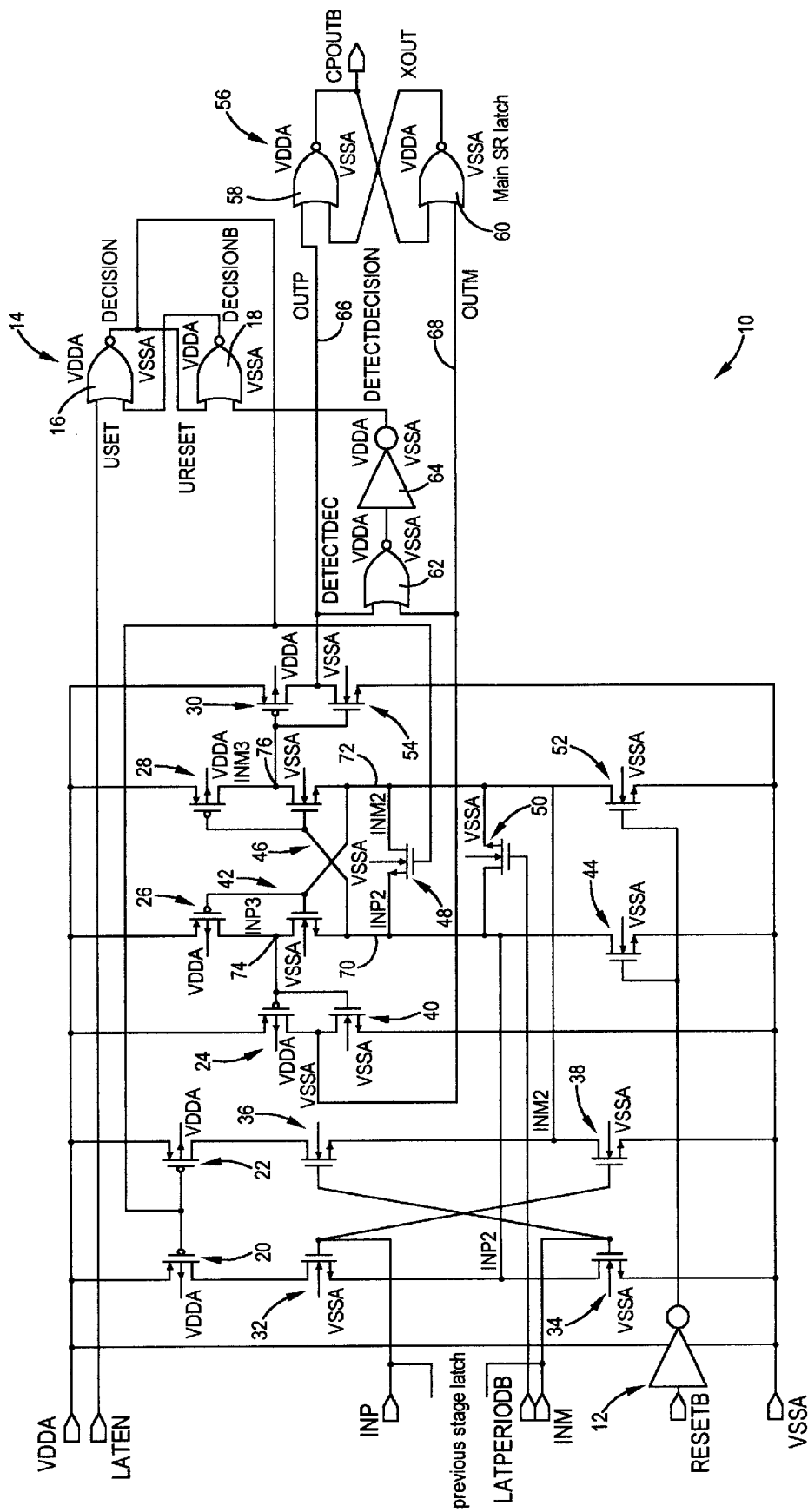
FIG. 1 is a circuit diagram illustrating a detection circuit which is in accordance with an embodiment of the present invention.

FIG. 1 illustrates a detection circuit 10 which is in accordance with an embodiment of the present invention. The circuit 10 provides improved metastability performance, and provides a high common mode rejection ratio and high common mode input range. The circuit 10 also has a large input hysteresis range that improves metastability rejection. The large differential hysteresis prevents small signals from propagating. The circuit 10 senses when a decision is made and prevents multiple decisions per clock cycle, as well as reduces the amount of time required to make a decision for a small, metastable-prone input signal.

As shown, the circuit 10 includes several input leads (identified in FIG. 1 as "VDDA", "LATEN", "INP", "LATPERIODB", "INM", "RESETB" and "VSSA") and an output lead (identified in FIG. 1 as "CPOUTB"). As shown, an inverter 12 is preferably connected to input "RESETB".

Preferably, a comparator, latch or pre-amplifier drives inputs "INP" and "INM", wherein input "INP" is a positive input which comes from the previous stage (i.e., the upstream comparator, latch or pre-amplifier), and "INM" is a negative input which comes from the previous stage (i.e., the upstream comparator, latch or pre-amplifier). Inputs "INP" and "INM" are effectively high impedance nodes which prevent the previous stage outputs from being loaded into the detection circuit 10. The detection circuit 10 preferably still draws no static current. Although the circuit 10 shown in FIG. 1 is generally described and discussed as if a comparator were driving inputs "INP" and "INM", alternatively a latch, pre-amplifier or some other device may drive inputs "INP" and "INM" of the detection circuit 10. Hence, the detection circuit 10 shown in FIG. 1 should not be understood to be limited to being used in connection with comparators.

Inputs "VDDA" and "VSSA" comprise the power supply to the detection circuit 10. Specifically, "VDDA" is a positive power supply, and input "VSSA" is a negative power supply. The signal along input "VSSA" may not, in fact, be negative, but preferably the signal which is carried along input "VSSA" is lower in potential than the signal which is carried along input "VDDA". The signals which are carried along inputs "VDDA" and "VSSA" are often referred to as the "supply rails".

Input "LATEN" is an active high digital control signal which resets a latch 14 (consisting of interconnected logic devices, such as nor gates "USET" (16) and "URESET" (18) shown in FIG. 1) of the detection circuit 10. Input "RESETB" is an active low digital signal which resets the detection circuit 10 for receiving new input signals along inputs "INP" and "INM". Input "RESETB" must be strobed low before a new decision will be made by the detection circuit 10. When input "LATPERIODB" is high, new input signals (i.e., along "INP" and "INM") are prevented from coming into the detection circuit 10.

As shown, the detection circuit 10 includes several transistors 20–54, some of which are p-channel transistors (i.e., 20, 22, 24, 26, 28, 30) and some of which are n-channel transistors (i.e., 32, 34, 36, 38, 40, 42, 44, 46, 48, 50, 52, 54) (the n-channel transistors and p-channel transistors shown in FIG. 1 could be swapped in the entire circuit). Additionally, the detection circuit 10 includes two memory devices, such as latches 14 and 56, each of which is formed of a pair of interconnected logic devices, such as nor gates 16 and 18, and 58 and 60, respectively as shown in FIG. 1. As shown, the output lead of latch 56 is output "CPOUTB" of the detection circuit 10.

One input (the reset signal) of latch 14 is input "LATEN" while the other input of latch 14 (the set signal) is driven by one or more logic devices, such as a nor gate 62 and inverter 64 as shown in FIG. 1. The nor gate 62 is connected to two output leads 66 and 68 which drive the latch 56. Preferably, nodes 74 and 76 are buffered to decrease propagation delays when heavily loaded. Specifically, the nodes 74 and 76 are buffered by transistors 30 and 54 and by transistors 24 and 40. As will be described in more detail, the output of latch 14 is used to turn on transistor 48 and effectively short "INP" and "INM" together so no differential input is effectively seen by the detection circuit 10, and multiple decisions are prevented.

Operation of the detection circuit 10 will now be described. In the following description, it is assumed that initial conditioning of the detection circuit 10 is as follows. It is assumed that the detection circuit 10 is initially reset with the output of latch 14 being low (decision=0) and with "INP" and "INM" initially at ground. Leads 70 and 72 are at ground from input "RESETB" strobing to low from high (wherein the input "RESETB" is normally high and is strobed low). With leads 70 and 72 at ground, transistors 26 and 28 will be on, transistors 42 and 46 will be off, and nodes 74 and 76 will be pulled to "VDDA". With nodes 74 and 76 at "VDDA", output leads 66 and 68 will be at ground via the action of the buffering invertors of transistor 30 and 54 with transistors 24 and 40, respectively.

For simiplicity, the case where upstream circuitry subsequently (after the initial conditioning of the detection circuit 10) drives "INP" to "VDDA", and where "INM" remains at ground will be described. In such a case where "INP" is driven to "VDDA" and "INM" is at ground, transistors 32 and 38 turn on forcing lead 70 to (vdda−vt) and lead 72 to ground (both transistor 34 and transistor 36 are off with "INM" at ground). Since these inputs are transistor gates, very limited current is drawn from the previous stage (i.e., along inputs "INP" and "INM"). With lead 70 at (vdda−vt) and lead 72 at ground, transistor 46 turns on and overdrives transistor 28 (which was previously almost off) forcing node 76 to ground. As node 76 goes to ground, output lead 66 goes high, strobing nor gate 62, forcing the output of latch 14 high and transistor 48 on and sets the output "CPOUTB" low. Transistor 48 effectively prevents either transistor 42 or 46 from turning on which ultimately prevents any new inputs (along "INP" and "INM") from propagating through the detection circuit 10 for the present clock cycle, and limits the time period for decision making. The large differential hysteresis prevents small signals from propagating. Hence, in normal operation, the detection circuit 10 prevents multiple decisions within a single clock cycle. The detection circuit effectively uses an or gate (i.e., nor gate 62 and inverter 64, or some other logic device) to sense when either output 66 or 68 is asserted high. If either is asserted high, the output from the inverter 64 (i.e., the input lead into latch 14) goes high and sets the latch 14 such that output of the latch 14 is high (and the internal feedback signal of the latch 14) is low. The high output signal turns on transistor 48 which effectively shorts "INP" and "INM" together so no differential input will be seen by the detection circuit 10, thereby preventing multiple decisions.

A potential metastability condition will now be described, assuming the detection circuit 10 has been initially conditioned as described above. Specifically, the case where upstream circuitry is in a metastable state with "INP" and "INM" balanced between the supply rails (i.e., between "VSSA" and "VDDA") will be described. In such a case where "INP" and "INM" are balanced between the supply rails (i.e., between "VSSA" and "VDDA"), leads 70 and 72 are generally equal, and are limited to a maximum of (vdda−(vt+vbody)). Hence, transistors 42 and 46 will always be off, transistors 26 and 28 will always be on, output leads 66 and 68 will always be low, and the output of latch 56 (i.e., "CPOUTB") will hold its previous clock cycle value. The previous value of the output of latch 56 is still valid because the input from the previous stage (i.e., "INP" and "INM") is obviously very near the trip point for a balanced condition to exist.

Subsequently, if the inputs "INP" and "INM" are driven slowly apart to a sufficient differential, such as to a differential greater than 2 vts (approximately 1.3 volts), either transistor 42 or transistor 46 turns on, and a decision is detected at output lead 66 or 68. Subsequently, transistor 48 turns on and prevents any new decisions (i.e., prevents new inputs along "INP" and "INM" from propagating substantially through the detection circuit 10) from being made by the detection circuit 10 for the present clock cycle. The large differential hysteresis prevents small signals from propagating, and transistor 48 effectively limits the time period for decision making.

If a pre-determined time has been allocated for a decision to be made, and inputs "INP" and "INM" are driven to the required differential (i.e., to a differential greater than 2 vts (approximately 1.3 volts)) after the allocated time has expired, input "LATPERIODB" is asserted high by a timing circuit (not shown) and a new decision is prevented (by the activation of transistor 48) from being made by the detection circuit 10 in the latter portion of the present clock it cycle. In this case, the previous output "CPOUTB" is still valid because the input from the previous stage (i.e., along "INP" and "INM") is obviously very near the trip point for a balanced condition to exist.

The detection circuit 10 is configured to provide improved metastability performance. Preferably, the circuit 10 uses minimum sized devices, is relatively insensitive to offsets and parasites due to the large hysteresis ranges provided by the circuit 10. The circuit 10 is, configured to provide a high common mode rejection ratio and high common mode input range, and has a large input hysteresis range that improves metastability rejection. The large differential hysteresis prevents small signals from propagating. The circuit 10 senses when a decision is made and prevents multiple decisions per clock cycle, as well as reduces the amount of time required to make a decision for a small, metastable prone input signal. While a preferred embodiment of the present invention is shown and described, it is envisioned that those skilled in the art may devise various modifications of the present invention without departing from the spirit and scope of the appended claims.

What is claimed is:

1. A detection circuit for receiving a pair of unstable input signals along a pair of input leads and providing a stable output signal along an output lead, said detection circuit comprising: a first transistor and a second transistor, wherein at least one of said first and second transistors is configured to turn on upon said detection circuit receiving input signals along the pair of input leads, and wherein at least one of said first and second transistors is configured to provide a signal along a lead to circuitry which is configured to condition said output signal and turn on a third transistor, said third transistor being connected to said first and said second transistors such that when said third transistor turns on, said third transistor prevents said first and second transistors from turning on, thereby generally preventing any new input signals received along the input leads from propagating substantially through the detection circuit, further comprising a fourth transistor and a fifth transistor, said fourth and fifth transistors connected to said first and second transistors, wherein said first and second transistors are configured to be off and said fourth and fifth transistors are configured to be on when generally equal input signals are received along the input leads, wherein said detection circuit comprises means for holding a previous clock cycle value output at the output lead when generally equal input signals are received along the input leads.

2. The detection circuit as recited in claim 1, wherein said first, second and third transistors are n-channel transistors.

3. The detection circuit as recited in claim 1, further comprising a plurality of logic devices connected to at least one of said first, second and third transistors.

4. The detection circuit as recited in claim 3, wherein at least one of said logic devices is connected to a pair of output leads distinct from the output lead on which the stable output signal is provided.

5. The detection circuit as recited in claim 3, wherein an output of a first logic device is connected to an input of a second logic device and to the third transistor, and wherein an output of the second logic device is connected to an input of the first logic device.

6. The detection circuit as recited in claim 1, wherein said fourth and fifth transistors are n-channel transistors.

7. The detection circuit as recited in claim 1, further comprising a plurality of logic devices, wherein at least one of said logic devices is connected to a pair of output leads distinct from the output lead on which the stable output signal is provided, wherein said detection circuit comprises means to provide that said output leads are low when generally equal input signals are received along the input leads.

8. The detection circuit as recited in claim 7, wherein an output of a first logic device is connected to an input of a second logic device and to the third transistor, and wherein an output of the second logic device is connected to an input of the first logic device.

9. The detection circuit as recited in claim 1, wherein said detection circuit comprises means for turning on said third transistor upon a differential between the input signals being greater than 1.3 volts or 2 vts.

10. The detection circuit as recited in claim 1, wherein said detection circuit comprises means for turning on said third transistor upon a differential between the input signals being greater than 1.3 volts or 2 vts.

* * * * *